United States Patent [19]

Sakurai

[11] Patent Number: 4,670,719
[45] Date of Patent: Jun. 2, 1987

[54] DIGITALLY PROCESSING AUTOMATIC GAIN CONTROL CIRCUIT

[75] Inventor: Toyoaki Sakurai, Tokyo, Japan
[73] Assignee: NEC Corporation, Tokyo, Japan
[21] Appl. No.: 804,863
[22] Filed: Dec. 5, 1985
[30] Foreign Application Priority Data Dec. 5, 1984 [JP] Japan ............................ 59-184494[U]

[51] Int. Cl.⁴ .............................................. H03G 3/20
[52] U.S. Cl. ..................... 330/137; 330/279; 330/284
[58] Field of Search ............... 330/127, 129, 137, 278, 330/279, 284; 358/176, 178

[56] References Cited

FOREIGN PATENT DOCUMENTS 1107286 8/1984 U.S.S.R. ............................... 330/129

Primary Examiner—James B. Mullins
Attorney, Agent, or Firm—Burns, Doane, Swecker & Mathis

[57] ABSTRACT

An automatic gain control circuit includes a gain controllable amplifier, a sampling circuit sampling the output of the amplifier, a rewritable memory storing a contrast digital value, an analog/digital converter converting the sampled signal into a digital signal, a comparator comparing the digital signal with the contrast digital value and producing a comparator output when the digital signal and the contrast digital value are a predetermined relationship, the memory changing the storing content with the digital signal as a new contrast digital value in response to the comparator output, a digital/analog converter converting the contrast digital value into an analog value to be applied to the amplifier to produce a constant level output from the amplifier. The automatic gain control circuit may include a first counter and a second counter to determine the attack time and the recovery time.

9 Claims, 3 Drawing Figures

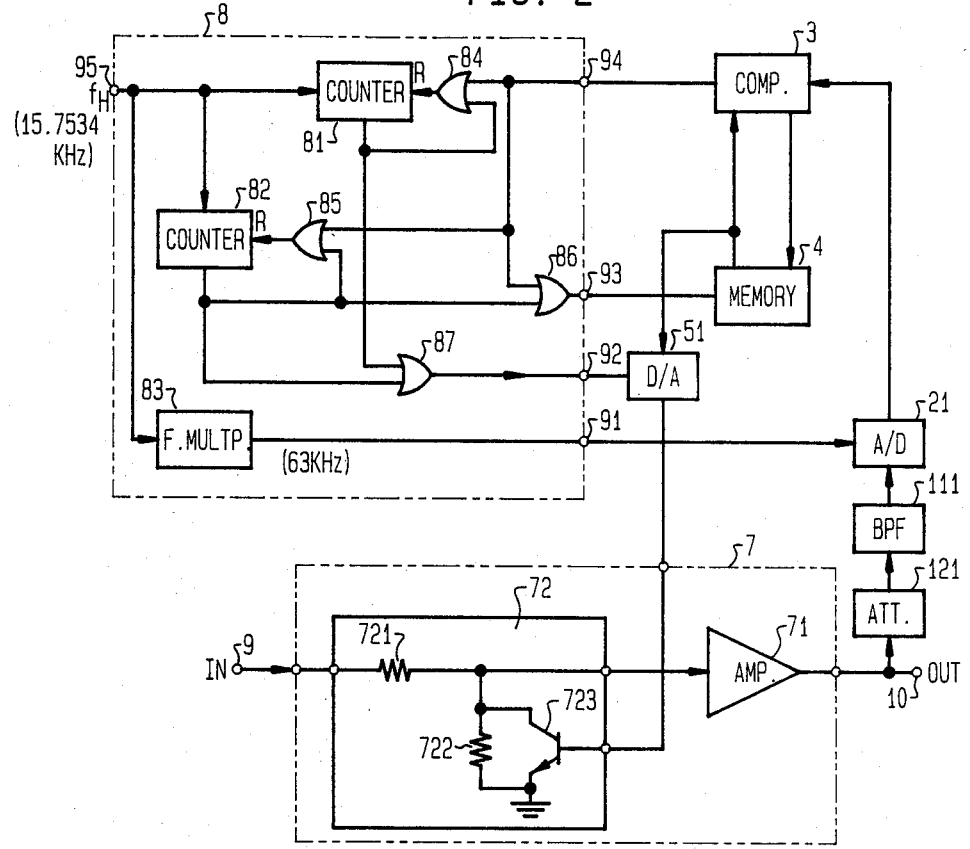

DIGITALLY PROCESSING AUTOMATIC GAIN CONTROL CIRCUIT

BACKGROUND OF THE INVENTION

1. Field of the Invention

The present invention relates to an automatic gain control circuit (AGC) that is used in an automatic loudness control circuit (ALC) for an audio signal or the like.

2. Description of the Prior Art

In an automatic gain control circuit widely used for automatic control of a loudness or automatic control of an output level, provision is made such that an amplification factor of an amplifier can be automatically controlled depending upon an output of the amplifier. More particularly, provision is made such that an output of an amplifier is rectified, the rectified output being converted into a D.C. voltage in a smoothing circuit, and the converted D.C. voltage is adjusted to an appropriate level in a control circuit, followed by controlling the gain of the amplifier by the level adjusted D.C. voltage. The gain of the amplifier is automatically controlled by controlling the input signal level according to the output of the control circuit or by controlling an amount of negative feedback according to the output of the control circuit.

The smoothing circuit is normally formed by an integrating circuit consisting of a resistor and a capacitor. While it is easy in view of a manufacturing technique of resistor elements to precisely control the resistance values of the resistor elements, control for the capacitance of the capacitor is difficult and the capacitance has a large deviation. The deviation of the capacitances results in distribution of time constants of smoothing circuits. In other words, the time required after the rectified output has varied in the direction of increase until the D.C. output of the smoothing circuit is stabilized, and the time required after the rectified output has varied in the direction of decrease until the D.C. output of the smoothing circuit is stabilized, would deviate due to the deviation of the capacitance values. It results in deviation of the attack time after the input signal has increased until the gain of the amplifier is stabilized, and the recovery time after the input signal has decreased until the gain of the amplifier is stabilized.

If the attack time and the recovery time of the automatic gain control circuit should deviate, for instance, in a stereophonic reproducing system, balancing between the left-channel and right-channel sounds would be lost and hence, real live sound could not be reproduced. In addition, even in a monophonic audio system, sound quality of the output would vary among different sets, and in the worst case, distortion of the output would become remarkable.

SUMMARY OF THE INVENTION

One object of the present invention is to provide an automatic gain control circuit in which the attack time and the recovery time are not influenced by deviation of capacitor values.

Another object of the present invention is to provide an automatic gain control circuit in which the attack time and the recovery time can be controlled.

According to one feature of the present invention, there is provided an automatic gain control circuit comprising an input terminal for receiving an input signal, an amplifier for amplifying the input signal, said amplifier including gain control means, an output terminal for deriving an output from the amplifier, an analog/digital converter for converting the output of the amplifier into a digital value, a rewritable memory which stores a predetermined initial value, a comparator for comparing the digital value converted by the analog/digital converter with the stored value in the memory, means for rewriting the stored value in the memory in the case where the digital value is larger than the stored value in the memory, a digital/analog converter for converting the stored value in the memory into an analog value, means for controlling the gain control means in accordance with the analog value converted by the digital/analog converter, means for generating clock signals which control at least the operation of the analog/digital converter and the operation of the comparator, a first counter circuit for counting the clock signals up to a first number, which is reset when the comparator has determined that the digital value is larger than the stored content in the memory and after it has counted up to the first number, a second counter circuit for counting the clock signals up to a second number, which is reset when the comparator has determined that the digital value is larger than the stored content in the memory and after it has counted up to the second number, and means responsive to reset of the second counter circuit for rewriting the stored content of the memory to the digital value converted by the analog/digital converter at that moment. More preferably, the output of the amplifier is applied to the analog/digital converter after it has been attenuated by a predetermined attenuation ratio through an attenuator, and thereby setting of an output level can be achieved. In addition, while the initial value in the memory is normally set at such value that the amplifier operates initially at a maximum gain, so that when the digital output converted by the analog/digital converter is larger than the stored content in the memory, this digital output is written in the memory, on the contrary, the initial value in the memory could be set at such value that the amplifier operates initially at a minimum gain, so that when the digital output converted by the analog/digital converter is smaller than the stored content in the memory, this digital output is written in the memory.

According to the present invention, owing to the fact that a smoothing circuit is not necessitated, it is unnecessary to use a capacitor which inevitably has a large deviation in capacitance, and so, the attack time and the recovery time would not vary due to a distribution of circuit parameters of the component elements. Moreover, since the circuit parameters are preset in such manner that even if an input signal should become large, a stabilized output could be obtained within a counting period of the first counter circuit, the attack time can be arbitrarily controlled. When the input signal becomes small, after count-up of the second counter circuit, gain control is newly commenced, and so, the recovery time can be also arbitrarily controlled by means of the second counter circuit and the first counter circuit. In this way, the attack time and the recovery time can be controlled by circuit design without being influenced by a distribution of circuit parameters of the component elements.

BRIEF DESCRIPTION OF THE DRAWINGS

The above-mentioned and other objects, features and advantages of the present invention will become more apparent from the following detailed description of preferred embodiments of the invention taken in conjunction with the accompanying drawings, wherein:

FIG. 2 is a circuit diagram showing one preferred embodiment of the present invention.

Referring now to FIG. 1, an automatic gain control circuit in the prior art includes an amplifier 7 provided with gain control means. To this amplifier 7 is applied an input signal via an input terminal 9, and an output is derived therefrom via an output terminal 10. The output of the amplifier 7 is also applied to a rectifier circuit 11, in which the output signal is rectified. The rectified signal is applied to a smoothing circuit 5 to be converted into a D.C. voltage. The smoothing circuit 5 is constructed of an integrating circuit which consists of a resistor and a capacitor 12. The output of the smoothing circuit 5 is applied to the gain control means of the amplifier 7 after its D.C. level has been controlled by a control circuit 6.

Figure 1:
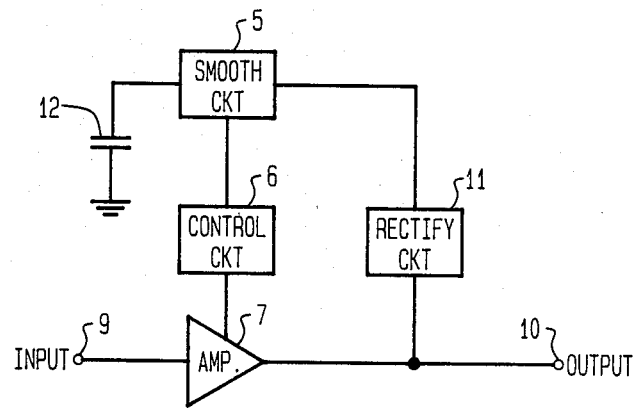
FIG. 1 is a circuit diagram showing an automatic gain control circuit in the prior art.

If the input signal becomes large and hence the output signal becomes large, then the output of the rectifier circuit 11 becomes large, the D.C. level generated from the smoothing circuit 5 is also raised, and the D.C. output signal controls the gain control means in the amplifier 7 so that the gain may be reduced. On the contrary, if the input signal becomes small, then the output signal also becomes small, the D.C. level generated from the smoothing circuit 5 is also lowered, and the D.C. output signal controls the gain control means in the amplifier 7 so that the gain may be enhanced. In this way, the gain of the amplifier 7 is controlled in such manner that the output of the amplifier may be always maintained constant.

However, the smoothing circuit 5 necessitates a capacitor. It is difficult in view of the manufacturing technique of the circuit elements to maintain the capacitance of this capacitor 12 at a precise value, and a deviation of the capacitance is large. Due to this deviation of a capacitance value, a time constant of an integrating circuit forming the smoothing circuit 5 would distribute. Accordingly, the time required after the input signal has varied until the gain of the amplifier is varied in accordance with the variation of the input signal to make the output constant (that is, the attack time and the recovery time) would distribute as a result of deviation of the capacitance value of the capacitor 12. The influence of this distribution would become remarkable when the automatic gain control circuit is used in a stereophonic audio system, and audio balance between the left and right channels would be lost. In a monophonic audio system also, sound quality of the output would vary among different audio sets, and when the distribution is extremely large, there would be an audio set in which distortion arises in the output.

DETAILED DESCRIPTION OF THE PREFERRED EMBODIMENTS

Describing now one preferred embodiment of the present invention with reference to FIG. 2, an automatic gain control circuit to be used in an audio amplifier for receiving stereophonic broadcast in a television receiver, is illustrated. An audio signal is received at an input terminal 9 and amplified by an amplifier section 7, and an output is derived from an output terminal 10.

The amplifier section 7 is composed of a level control section 72 for an audio input signal, which includes resistors 721 and 722 and a transistor 723, and an amplifier 71. In the initial state where a signal is not applied to the base of the transistor 723, the audio input signal is applied nearly in itself to the amplifier 71, and as the base voltage is raised, an attenuated audio input signal is applied to the amplifier 71. The output of the amplifier section 7 is subjected to attenuation of a predetermined ratio in an attenuator 121, and then it is applied via a band-pass filter 111 to an analog/digital converter 21. The attenuation ratio of the attenuator 121 determines the output level of the amplifier section 7. The band-pass filter 111 passes the signal of 20 Hz~20 KHz to eliminate noises other than the input signal. In the analog/digital converter 21, the audio signal fed from the band-pass filter 111 is sampled by sampling pulses fed from a terminal 91 of a control circuit 8, and then it is converted into a digital signal. This digital signal is applied to a comparator 3. In a memory 4 a less or least significant digital value, for instance, "0, 0, 0, 0" is preliminarily stored and in the initial state, the level control section 72 may not attenuate the audio input signal. This stored value in the memory 4 and the digital output value of the analog/digital converter 21 are compared with each other under control of the sampling pulses fed from the terminal 91. If the digital output value is larger than the stored value, then an output is generated at a terminal 94, and it controls the memory 4 via an OR gate 86 and a terminal 93 so that the compared digital output value may be rewritten and stored in the memory 4. As a clock applied through a terminal 95, the horizontal synchronizing signal $f_H$ (15.7534 KHz) of the television system is employed, and this clock signal is counted up to 48 by a counter 81. During this period of 48 counts, if the digital output value from the analog/digital converter 21 becomes larger than the stored content in the memory 4, then the counter 81 is reset via an OR gate 84, and also the stored content in the memory 4 is rewritten into the digital output value. If the digital output value does not become larger than the stored content in the memory 4 during the period of 48 counts, then an output of the counter 81 actuates a digital/analog converter 51 via an OR gate 87 and a terminal 92. The digital/analog converter 51 responds to the signal applied from the terminal 92 for reading out the stored content in the memory 4, converting it to an analog value and holding this analog value. This analog value is applied to the base of the transistor 723 in the level control section 72 to reduce an operating resistance of the transistor 723, hence the attenuation ratio of the audio input signal is increased, and thereby the output level at the output terminal 10 is lowered. The digital/analog converter 51 holds the converted analog value until the counter 81 counts the next 48 clock pulses. The clock applied via the terminal 95 is counted up to 5,250,000 by another counter 82. This is done for the purpose of resetting the gain of the amplifier section 7 when the audio input signal level will become lower than the current value. When the counter 82 has counted up to 5,250,000, the output of the counter 82 is applied to the memory 4 via the OR gate 86 and the terminal 93, so that the stored content in the memory 4 is rewritten into the digital output of the analog/digital converter 21 at that moment via the comparator 3. At the same time, in response to the signal applied via the OR gate 87 and the terminal 92, the digital/analog converter 51 takes in the rewritten content of the memory 4 and actuates the transistor 723 with that analog value. The count in this counter 82 is adapted to be reset via an OR gate 85 also when the digital output value of the analog/digital converter 21 becomes larger than the stored content in the memory 4. It is to be noted that as the sampling pulses provided at the terminal 91, pulses of 63 KHz which are derived from the clock pulses at the terminal 95 by frequency-multiplying by a factor of 4 in a frequency-multiplier 83, are employed.

As the audio input signal increases, when the output digital value from the analog/digital converter 21 has exceeded the stored content of the memory 4, subsequently after the counter 81 counts up to 48, the gain of the amplifier section would be varied. Since the clock frequency is 15.7534 KHz, after 3 msec when the counter 81 has counted up to 48, the gain would vary. In other words, the attack time is equal to 3 msec, and this can be adjusted by changing the maximum count value of the counter 81. Normally it is chosen in the range of 3 to 5 msec.

If the level of the audio input signal is decreased, an output signal is not issued any longer from the comparator 3. If this condition continues until the counter 82 counts up to 5,250,000, then the stored content in the memory 4 is rewritten and the next gain adjustment is effected. This period for counting up to 5,250,000 is the recovery time, and in the illustrated example, it is equal to 32 sec. This recovery time also can be adjusted by changing the maximum count value of the counter 32. Normally it is chosen in the range of 20 sec. to 1 min.

As described above, neither the attack time nor the recovery time is influenced by a distribution of a circuit parameter of the component element, but they are determined by the maximum count values of the counters 81 and 82. By varying these maximum count values, any arbitrary attack time and recovery time can be selected. Accordingly, in a stereophonic receiver it is possible to equalize the attack time and the recovery time, respectively, of the left-channel and right-channel amplifiers, and so, balance between the left and right channels can be maintained. Moreover, audio amplifiers having constant output sound quality can be mass-produced stably.

Figure 3:
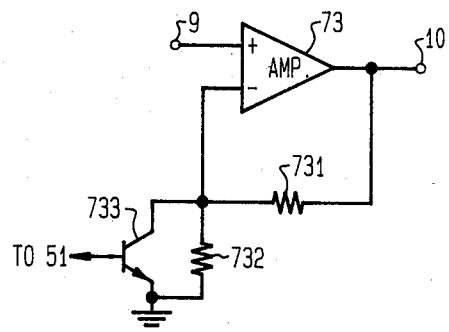
FIG. 3 is a circuit diagram showing a part of a modified embodiment of the present invention.

While the adjustment of the gain of the amplifier section 7 was effected by adjusting the level of the audio input signal in the above-described embodiment, as shown in FIG. 3 modification can be made such that a feedback amplifier 73 is employed in the amplifier section 7 and the gain control is effected by adjusting the negative feedback ratio. In more particular, an input terminal 9 is connected to a non-invert input end ⊕ of the feedback amplifier 73, a resistor 731 is connected between an invert input end ⊖ and an output terminal 10, a parallel circuit consisting of a resistor 732 and a transistor 733 is connected between the invert input end ⊖ and a reference potential, and the output of the digital/analog converter 51 could be applied to the base of the transistor 733. While this initial value of the stored content in the memory 4 was chosen at such value that the amplifier section 7 may operate at a maximum gain in the initial state, on the contrary it could be chosen at such value that the amplifier section 7 may operate at a minimum gain in the initial state. In this modified case, the stored content in the memory 4 is rewritten when the digital output of the analog/digital converter 21 is smaller than the stored content in the memory 4, and the transistor 723 is connected in parallel to the resistor 721.

What is claimed is:

1. An automatic gain control circuit comprising an amplifier having gain control means, a circuit for converting the output of said amplifier into a digital value, memory means for storing a contrast digital value, a comparator for comparing said digital value with said contrast digital value and generating an output when said respective digital values have a predetermined relationship, first means responsive to the output of said comparator for converting the contrast digital value stored in said memory means into said digital value currently applied from said converter circuit, second means for converting said contrast digital value into an analog value and applying it to said gain control means, means for receiving clock pulses, a counter which counts said clock pulses up to a positive integer N and produces an N-count output, said counter being reset by said output from said comparator, and third means responsive to said N-count output for causing said second means to convert said contrast digital value into said analog value to said gain control means.

2. An automatic gain control circuit as claimed in claim 1, in which said comparator generates said output when said digital value is larger than said contrast digital value.

3. An automatic gain control circuit as claimed in claim 1, in which said comparator generates and output when said digital value is smaller than said contrast digital value.

4. An automatic gain control circuit as claimed in claim 1, further comprising a second counter which counts said clock pulses up to a second positive integer M and produces an M-count output, said second positive integer M having a value larger than said first positive integer N, said second counter being reset by said output from said comparator, and fourth means responsive to said M-count output for rewriting said contrast digital value stored in said memory to said digital value currently applied from said converter circuit.

5. An automatic gain control circuit comprising an amplifier having gain control means, first means for deriving sampling pulses from clock signals, an analog/-digital converter for converting the output of said amplifier into a digital value in response to said sampling pulse, a first counter for counting said clock signals up to a first positive integer N, a second counter for counting said clock signals up to a second positive integer M, said second positive integer M having a value larger than said first positive integer N, a memory for storing a contrast digital value, a comparator for comparing said digital value with said contrast digital value in response to said sampling pulse and generating a comparator output when these respective digital values have a predetermined relationship, second means responsive to at least one of said comparator output and the output of said second counter for rewriting said contrast digital value in said memory into said digital value, and third means responsive to the output of at least one of said first counter and said second counter for converting said contrast digital value in said memory into an analog value and applying it to said gain control means, whereby the output of said amplifier can be adjusted to a predetermined level.

6. An automatic gain control circuit as claimed in claim 5, in which said first and second counters are reset by said comparator output.

7. An automatic gain control circuit as claimed in claim 6, in which said comparator generates said comparator output when said digital value is larger than said contrast digital value.

8. An automatic gain control circuit as claimed in claim 7, in which said analog/digital converter converts the output of said amplifier into a digital value after said output has been attenuated by a predetermined ratio by means of an attenuator.

9. An automatic gain control circuit as claimed in claim 6, in which said comparator generates said comparator output when said digital value is smaller than said contrast digital value.

* * * * *